(12) United States Patent
Chun et al.

(10) Patent No.: US 7,452,753 B2
(45) Date of Patent: Nov. 18, 2008

(54) METHOD OF PROCESSING A SEMICONDUCTOR WAFER FOR MANUFACTURE OF SEMICONDUCTOR DEVICE

(75) Inventors: Dae-Sang Chun, Chungcheongnam-do (KR); Jae-Hong Kim, Chungcheongnam-do (KR); Heui-Seog Kim, Chungcheongnam-do (KR); Jong-Keun Jeon, Chungcheongnam-do (KR); Wha-Su Sin, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 394 days.

(21) Appl. No.: 11/172,689

(22) Filed: Jun. 30, 2005

(65) Prior Publication Data
US 2006/0008948 A1  Jan. 12, 2006

(30) Foreign Application Priority Data
Jul. 6, 2004  (KR)  ...................... 10-2004-0052310

(51) Int. Cl.
*H01L 21/00* (2006.01)
(52) U.S. Cl. ................. 438/114; 438/464; 257/E21.599
(58) Field of Classification Search ................. 438/114, 438/464
See application file for complete search history.

(56) References Cited

U.S. PATENT DOCUMENTS

| | | | | |
|---|---|---|---|---|
| 5,888,883 | A * | 3/1999 | Sasaki et al. | 438/460 |
| 6,558,975 | B2 * | 5/2003 | Sugino et al. | 438/64 |
| 6,589,855 | B2 * | 7/2003 | Miyamoto et al. | 438/464 |
| 6,635,512 | B1 * | 10/2003 | Hikita et al. | 438/113 |
| 6,676,491 | B2 * | 1/2004 | Arai et al. | 451/57 |
| 6,730,579 | B1 * | 5/2004 | Sasaka | 438/464 |
| 6,756,288 | B1 * | 6/2004 | Feil et al. | 438/464 |

(Continued)

FOREIGN PATENT DOCUMENTS

JP  11-040520  2/1999

(Continued)

OTHER PUBLICATIONS

English language abstract of the Korean Publication No. 2001-29981.

(Continued)

*Primary Examiner*—David A Zarneke
(74) *Attorney, Agent, or Firm*—Marger Johnson & McCollom, P.C.

(57) ABSTRACT

A method of processing a semiconductor wafer that has a first surface and a second surface opposite to the first surface. The method includes forming grooves of a predetermined depth on the second surface on which circuit patterns are formed, attaching a first surface of a protective tape to the second surface on which the grooves are formed, attaching a carrier tape to a second surface of the protective tape opposite to the first surface of the protective tape so that the first surface of the semiconductor wafer can be oriented upward, removing the first surface of the semiconductor wafer by a predetermined thickness and dividing the semiconductor wafer into chips by the grooves, and supplying each chip to a die bonder in the state where the first surface of the of the chip is oriented upward. Only one kind of die bonder is needed. A UV-type tape is not required.

10 Claims, 5 Drawing Sheets

U.S. PATENT DOCUMENTS

| | | | |
|---|---|---|---|
| 6,777,310 B2* | 8/2004 | Inuzuka | 438/460 |
| 6,821,866 B2* | 11/2004 | Subramanian | 438/460 |
| 7,060,532 B2* | 6/2006 | Takyu et al. | 438/114 |
| 7,087,502 B2* | 8/2006 | Priewasser et al. | 438/464 |
| 7,221,059 B2* | 5/2007 | Farnworth et al. | 257/778 |

FOREIGN PATENT DOCUMENTS

| | | |
|---|---|---|
| JP | 2001-035817 | 2/2001 |
| JP | 2002-100588 | 4/2002 |
| JP | 2003-17513 | 1/2003 |
| KR | 2001-29981 | 4/2001 |

OTHER PUBLICATIONS

English language abstract of the Japanese Publication No. 2002-100588.

English language abstract of the Japanese Publication No. 2003-17513.

English language abstract of Japanese Publication No. 11-040520, Feb. 12, 1999.

English language abstract of Japanese Publication No. 2001-035817, Feb. 9, 2001.

* cited by examiner

UV

METHOD OF PROCESSING A SEMICONDUCTOR WAFER FOR MANUFACTURE OF SEMICONDUCTOR DEVICE

This application claims the priority of Korean Patent Application No. 2004-52310, filed on Jul. 6, 2004, in the Korean Intellectual Property Office, the disclosure of which is incorporated herein in its entirety by reference.

BACKGROUND OF THE INVENTION

1. Field of the Invention

The present invention relates to a method of processing a semiconductor wafer for the manufacture of a semiconductor device, and more particularly, to a method of processing a semiconductor wafer using a die bonder.

2. Description of the Related Art

In general, semiconductor devices are manufactured by forming proper circuit patterns on a surface of a semiconductor wafer and dividing the semiconductor wafer into chips. Further processes to complete the manufacture of the semiconductor devices may include a process of bonding each chip on a lead frame and a process of sealing the chip into a package. The die bonding process of bonding the chip to the lead frame is performed using a die bonder, for example, a conventional die bonder or a lead-on-chip (LOC) die bonder. When those die bonders are used, a semiconductor wafer is supplied in the state where a surface on which circuit patterns are formed is oriented upward.

FIGS. 1 through 3 are sectional views of a conventional method of processing a semiconductor wafer for the manufacture of a semiconductor device.

Referring to FIG. 1, a semiconductor wafer 100' has a first surface 101 that is a bottom surface and a second surface 102 that is a top surface. A protective tape 110 is attached on the second surface 102 of the semiconductor wafer 100'. Here, various circuit patterns are formed on the second surface 102 of the semiconductor wafer 100'. The protective tape 110 is an ultraviolet (UV) tape. Next, the semiconductor wafer 100' is ground from the first surface 101 to a portion indicated by a dotted line to reduce a thickness "d" of the semiconductor wafer 100'.

Referring to FIG. 2, the protective tape 110 is removed, and then, a carrier tape 120 is attached to the first surface 101 of the thinned semiconductor wafer 100'. The carrier tape 120 is used to carry the semiconductor wafer 100' after the semiconductor wafer 100' is divided into individual chips. Rings 130 are attached on both edges of the carrier tape 120.

Referring to FIG. 3, the semiconductor wafer 100' is cut by a cutting unit, for example, a dicing blade, into individual semiconductor chips 100. Each semiconductor chip 100 is carried to a die bonder. At this time, UV rays are emitted to the first surface 101 in order to remove an adhesive force between the semiconductor chip 100 and the carrier tape 120.

The conventional method of processing the semiconductor wafer has the following problems. As shown in FIG. 3, the semiconductor chip 100 is transferred to the die bonder in the state where the second surface 102 on which the circuit patterns are formed is oriented upward. Accordingly, a conventional die bonder and an additional LOC die bonder should be selectively used depending on the shape of a semiconductor package to be manufactured. That is, a conventional die bonder should be used to manufacture a quad flat package (QFP), and an LOC die bonder should be used to manufacture an LOC package. Two different kinds of die bonders should be prepared and used depending on the kind of the manufactured package, resulting in unnecessary costs.

SUMMARY OF THE INVENTION

The present invention provides a method of processing a semiconductor wafer, which can perform a die bonding process using a conventional die bonder as well as a lead-on-chip (LOC) die bonder.

According to an embodiment of the present invention, there is provided a method of processing a semiconductor wafer, which has a first surface and a second surface opposite to the first surface, the method comprising: forming grooves of a predetermined depth on the second surface on which circuit patterns are formed; attaching a first surface of a protective tape to the second surface on which the grooves are formed; attaching a carrier tape to a second surface of the protective tape opposite to the first surface of the protective tape so that the first surface of the semiconductor wafer can be oriented upward; removing the first surface of the semiconductor wafer by a predetermined thickness and dividing the semiconductor wafer into chips by the grooves; and supplying each chip to a die bonder in the state where the first surface of the of the chip is oriented upward.

The operation of supplying the chip to the die bonder may comprise attaching a carrier unit to the first surface of the chip and moving the carrier unit to the die bonder.

The method may further comprise: placing the chip attached to the carrier unit on a stage so that the second surface of the chip can face lead frames on the stage; and attaching the second surface of the chip to the lead frames.

The operation of attaching the chip to the lead frames may be performed through a compression process using a compression unit. The compression process using the compression unit may be performed a plural number of times to include partial compression and complete compression.

The operation of placing the chip attached to the carrier unit on the stage may comprise analyzing the patterns formed on the second surface of the chip and aligning the chip on a proper position of the stage.

The operation of placing the chip attached to the carrier unit on the stage may comprise recognizing edges of the chip and aligning the chip on a proper position of the stage.

The operation of supplying the chip to the die bonder may comprise aligning the chip and placing the chip on a proper position of the die bonder.

The operation of aligning the chip may be performed by detecting at least three recognition points on the second surface of the chip.

BRIEF DESCRIPTION OF THE DRAWINGS

The above and other features and advantages of the present invention will become more apparent by describing in detail exemplary embodiments thereof with reference to the attached drawings.

DETAILED DESCRIPTION

The present invention will now be described more fully with reference to the accompanying drawings, in which preferred embodiments of the invention are shown.

Figure 1:
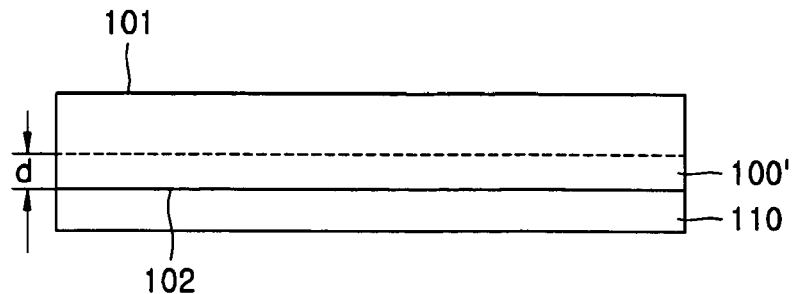
FIGS. 1 through 3 are sectional views of a conventional method of processing a semiconductor wafer for the manufacture of a semiconductor device.
Figure 2:
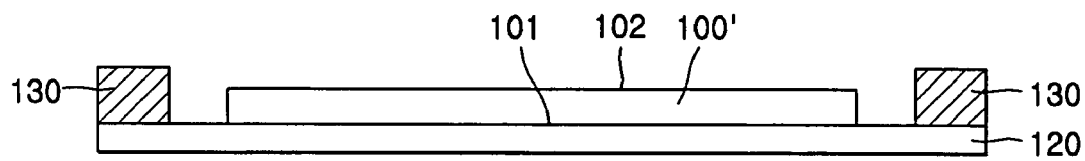
Figure 3:
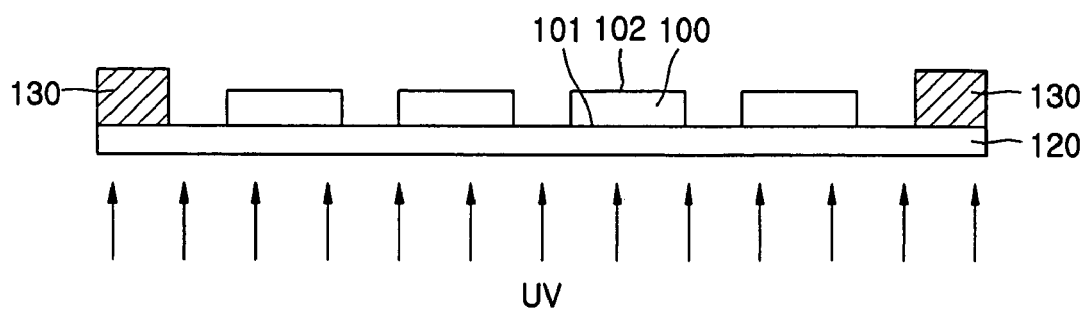
Figure 4:
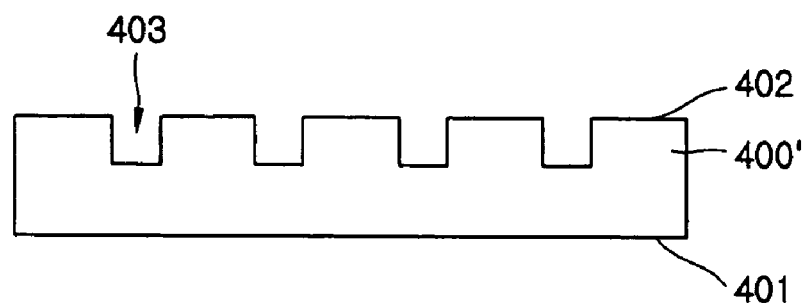
FIGS. 4 through 6 are sectional views of a method of processing a semiconductor wafer for the manufacture of a semiconductor device according to an embodiment of the present invention.
Figure 5:
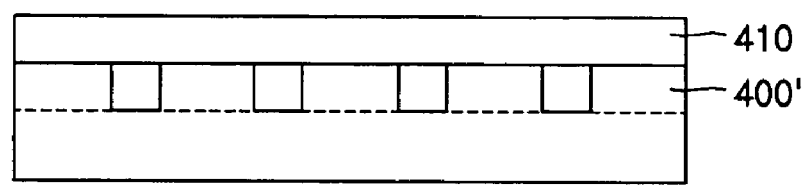
Figure 6:
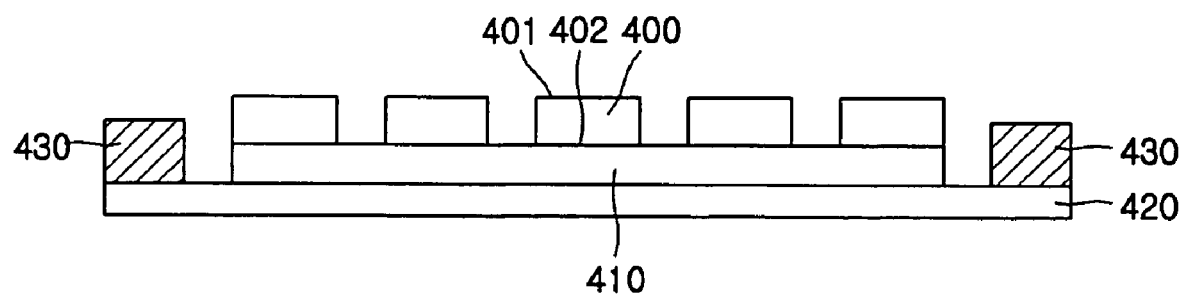

FIGS. 4 through 6 are sectional views of a method of processing a semiconductor wafer for the manufacture of a semiconductor device according to an embodiment of the present invention.

Referring to FIG. 4, a semiconductor wafer 400' has a first surface 401 and a second surface 402. A plurality of grooves 403 are formed on the second surface 402 of the semiconductor wafer 400'. Here, the second surface 402 of the semiconductor wafer 400' is a top surface on which circuit patterns are formed. Although not shown, the grooves 403 have shapes of long cross stripes by which a plurality of semiconductor chip areas are divided.

Referring to FIG. 5, a protective tape 410 is attached on the second surface 402, on which the grooves 403 are formed, of the semiconductor wafer 400'. The semiconductor wafer 400' material is removed from the first surface 401 of the semiconductor wafer 400' to the bottom of the grooves 403, that is, to a planar boundary indicated by a dashed line, to reduce the thickness of the semiconductor wafer 400'. Then, semiconductor chips 400 divided by the grooves 403 are completely produced from the semiconductor wafer 400'.

Referring to FIG. 6, the semiconductor wafer 400' is turned upside down and then a carrier tape 420 is attached to the inverted semiconductor wafer 400'. Since the carrier tape 420 is attached to the inverted semiconductor wafer 400', none of the semiconductor chips 400 directly contacts the carrier tape 420. Instead, the protective tape 410 contacts the carrier tape 420. Accordingly, there is no need to use an ultraviolet (UV) tape as the carrier tape 420, thereby reducing costs. There are some cases in the conventional art where a carrier tape of particularly high quality must be used. However, according to an embodiment of the present invention, a user can freely select the carrier tape 420, thereby further reducing costs. Rings 430 are disposed on edges of the carrier tape 420, as shown.

Figure 7:
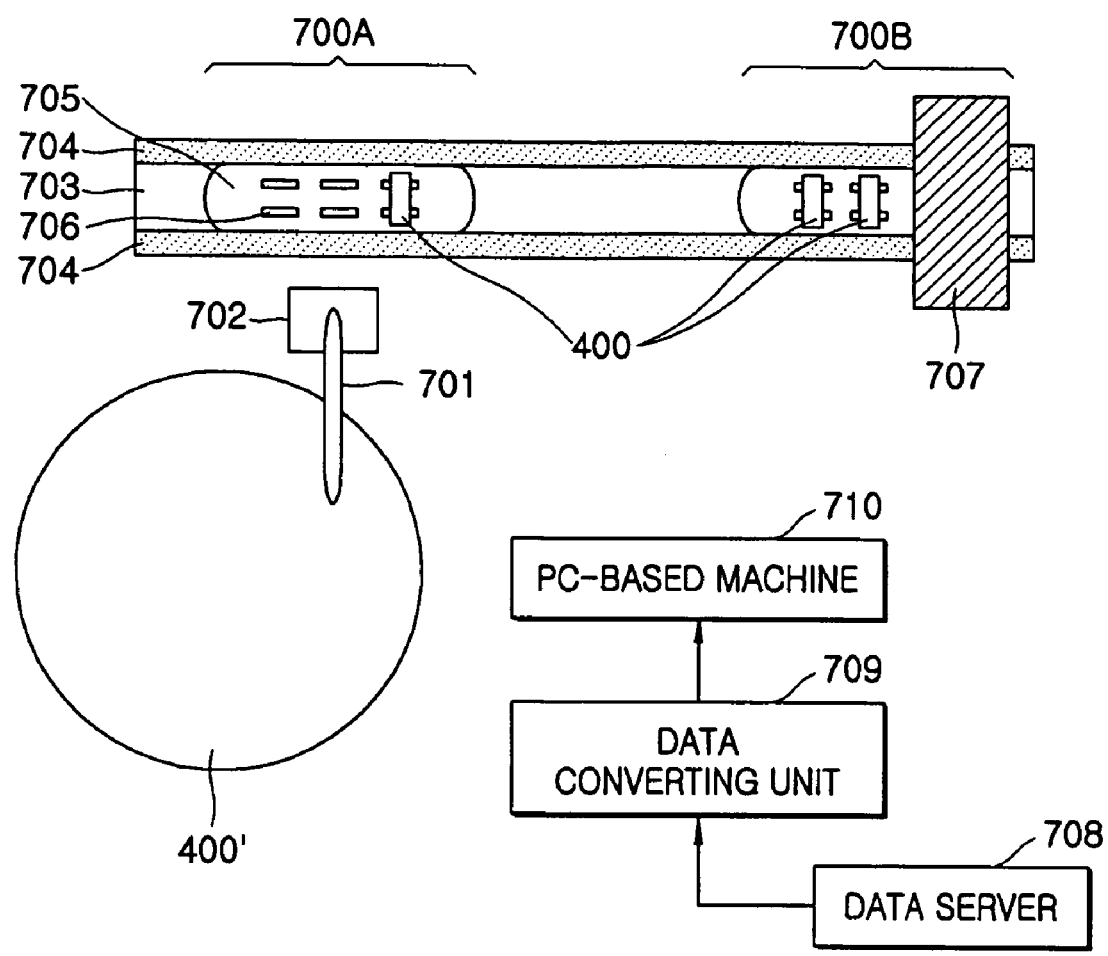
FIG. 7 is a diagram of a die bonder used in the method of processing the semiconductor wafer according to an embodiment of the present invention.

FIG. 7 is a diagram of a conventional die bonder used in the method of processing the semiconductor wafer according to the present invention. FIGS. 8 through 11 are sectional views illustrating operations for processing the semiconductor wafer using the die bonder shown in FIG. 7. More specifically, FIGS. 8 through 11 illustrate operations for manufacturing a lead-on-chip (LOC) type package.

Referring to FIG. 7, a die bonder includes a carrier unit 701 for carrying each chip 400 separated from the semiconductor wafer 400', a heat block 702 for aligning the chip 400, and a stage 703 for attaching the semiconductor chip 400 to lead frames 705. At least two compression processes are performed on the stage 703. To this end, the stage 703 includes a first compression area 700A and a second compression area 700B. Guides 704 are disposed along either side of the stage 703. The lead frames 705 to which the semiconductor chip 400 is attached and strip tapes 706 are disposed on the lead frames 705 on stage 703. A mount head 707 in which a heater is embedded is disposed in the second compression area 700B. The die bonder constructed as above is controlled by a personal computer (PC)- or other suitably processor-based machine 710. The PC-based machine 710 receives data concerning whether a particular chip 400 of wafer 400' is good or bad, i.e., whether or not it passed one or more wafer-level tests, from a data server 708. Since the first surface 401 of the semiconductor wafer 400' is oriented upward, the conventional data concerning whether the chip 400 is good or bad that is transferred from the data server 708 is converted by a data converting unit 709 and then transmitted to the PC-based machine 710.

Those of skill in the art will appreciate that data converting unit 709 is programmed to map first-wafer-surface good/bad chip data into second-wafer-surface good/bad chip data. Such straightforwardly can be accomplished by table look-up or other suitable software means, or even more simply by a hard-wired mapping matrix or programmed logic array (PLA) or read-only memory (ROM) device. Importantly, the mapping function permits the die bonder properly to determine which semiconductor chips 400 are good and bad, despite the upside-down inversion of wafer 400' that effectively reverses the conventionally acquired, upright-wafer good/bad chip position data, left to right and/or top to bottom. Thus, any suitable means for mapping the wafer positions of the determinedly good/bad chips from first-surface-relevant positional data to second-surface-relevant positional data is contemplated as being within the spirit and scope of the invention.

An example of operations for processing the semiconductor wafer using such a die bonder is as follows.

Figure 8:
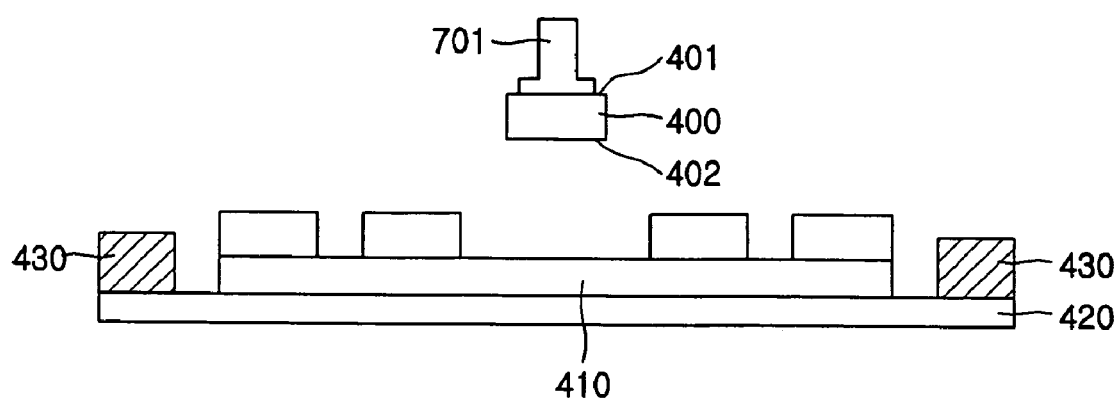
FIGS. 8 through 11 are sectional views illustrating operations for processing the semiconductor wafer using the die bonder shown in FIG. 7.
Figure 9:
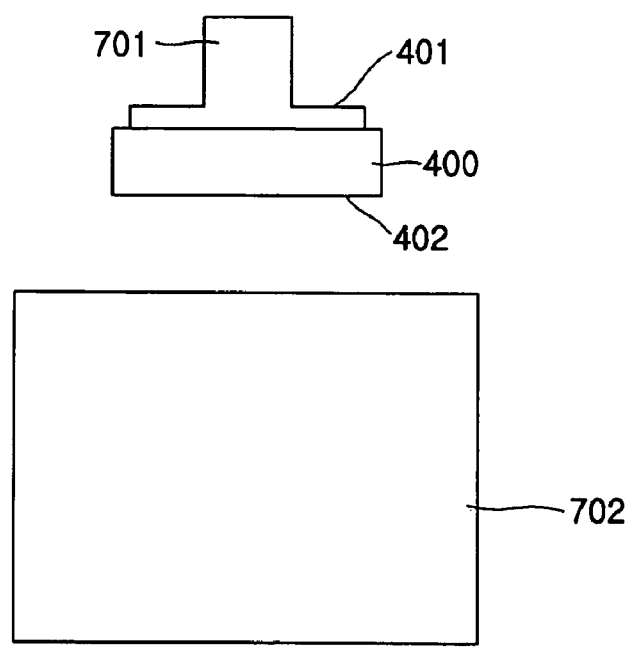

Referring to FIG. 8, the semiconductor chip 400 is supplied by the carrier unit 701 to the die bonder in an orientation wherein the second surface 402 on which the circuit patterns are formed is oriented downward and the opposite first surface 401 is oriented upward, as described with reference to FIGS. 4 through 6. The carrier unit 701 is attached to the first surface 401 of the semiconductor chip 400, and the semiconductor chip 400 to which the carrier unit 701 is attached is supplied to the die bonder. Referring to FIG. 9, the carrier unit 701 conveys the chip 400 on the heat block 702 and aligns the chip 400 on the lead frames 705 on stage 703 (see FIG. 7). The alignment of the semiconductor chip 400 may be carried out after the semiconductor chip 400 is supplied to the stage 703. In this case, the alignment on the heat block 702 may be omitted. There are many alignment methods. For example, the semiconductor chip 400 may be aligned by analyzing the patterns formed on the second surface 402 of the semiconductor chip 400 or by recognizing edges of the semiconductor chip 400. Otherwise, the semiconductor chip 400 may be aligned by sensing at least three recognition points on the second surface 402 of the semiconductor chip 400.

Figure 10:
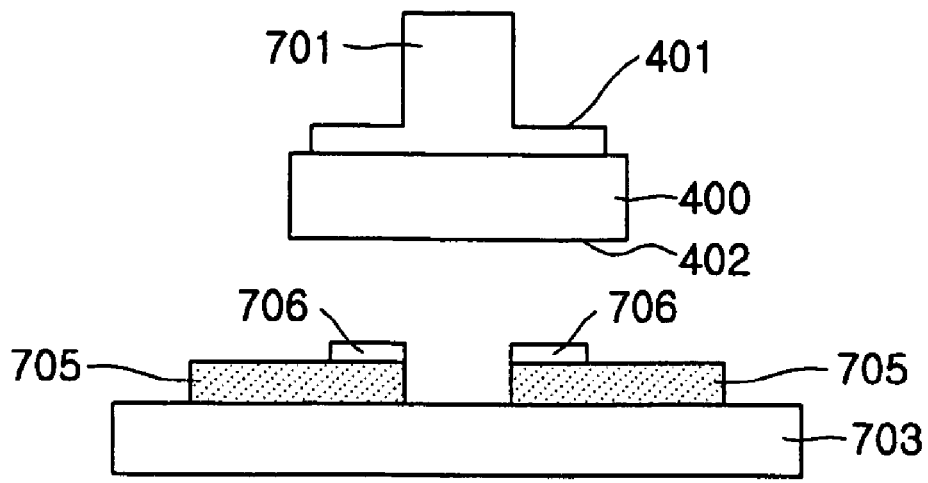
Figure 11:
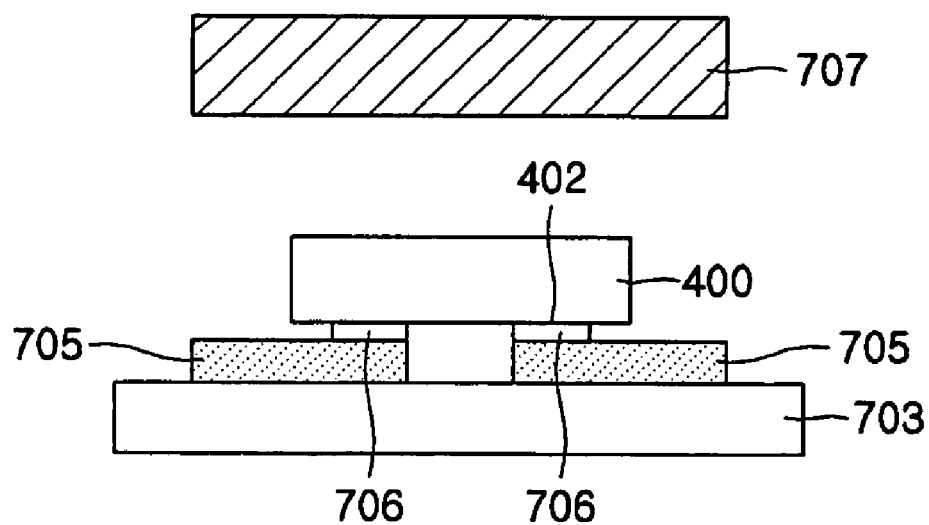

Referring to FIG. 10, the aligned semiconductor chip 400 is conveyed to the lead frames 705 on the stage 703 by the carrier unit 701. The semiconductor chip 400 can be aligned thereon in any suitable manner, as previously mentioned. The second surface 402 of the semiconductor chip 400 is deposited onto the lead frames 705 equipped with the tapes 706. In this orientation and alignment, the second surface 402 of the semiconductor chip 400 contacts the tapes 706 so that the semiconductor chip 400 is affixed to the lead frames 705. Next, referring to FIG. 11, a compression process, whether partial or complete or both, is performed on the semiconductor chip 400 using a compression unit, e.g., a mount head, 707 in which a heater is embedded. The semiconductor chip 400 and the lead frames 705 adhere to one another through the compression/heat process.

Each of the semiconductor chips 400 die bonded to its respective lead frames 705 is conveyed from the die bonder to a downstream system, e.g., a conventional semiconductor chip packaging system.

As described above, the method of processing the semiconductor wafer for the manufacture of the semiconductor device according to the present invention supplies the semiconductor chip to the die bonder in an orientation wherein the surface on which the circuit patterns are not formed is oriented upward. Thus, an LOC type die bonding process can be performed using a conventional die bonder. Accordingly, an additional LOC die bonder is not required, thereby preventing unnecessary investment in system and cost. By the straightforward expedient of front-side to back-side good/bad data conversion, the conventionally acquired back-side good/bad chip location data can be converted to front-side good/bad chip location data for selective die bonding of only good chips yielded from the wafer. Further, since the carrier tape does not directly contact the semiconductor wafer, the quality and reliability of the carrier tape is not as important as with conventional semiconductor wafer/chip processing, and a relatively inexpensive carrier tape can be used.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of processing a semiconductor wafer that has a first surface and a second surface opposite to the first surface, the method comprising:

forming grooves of a predetermined depth on the second surface of the wafer on which circuit patterns are formed;

attaching a first surface of a protective tape to the second surface on which the grooves are formed;

attaching a carrier tape to a second surface of the protective tape opposite to the first surface of the protective tape so that the first surface of the semiconductor wafer can be oriented upward;

removing the first surface of the semiconductor wafer by a predetermined thickness and dividing the semiconductor wafer into chips at the grooves, the chips having a second surface on which the circuit patterns are formed; and supplying each chip to a die bonder in an orientation wherein a first surface opposite to the second surface of the chip is facing upward.

2. The method of claim 1, wherein the supplying each chip to the die bonder comprises attaching a carrier unit to the first surface of the chip and moving the carrier unit to the die bonder.

3. The method of claim 2, further comprising:

placing the chip attached to the carrier unit on a stage so that the second surface of the chip can face lead frames on the stage; and attaching the second surface of the chip to the lead frames.

4. The method of claim 3, wherein the attaching the second surface of the chip to the lead frames is performed by a compression process using a compression unit.

5. The method of claim 4, wherein the compression process using the compression unit is performed a plural number of times to include partial compression and complete compression.

6. The method of claim 3, wherein the placing the chip attached to the carrier unit on the stage comprises analyzing the circuit patterns formed on the second surface of the chip and aligning the chip in a proper position and orientation on the stage.

7. The method of claim 3, wherein the placing the chip attached to the carrier unit on the stage comprises recognizing edges of the chip and aligning the chip in a proper position and orientation on the stage.

8. The method of claim 1, wherein the supplying each chip to the die bonder comprises aligning the chip and placing the chip in a proper position and orientation on the die bonder.

9. The method of claim 8, wherein the aligning the chip is performed by sensing at least three recognition points on the second surface of the chip.

10. The method of claim 1, wherein data representing a position on a first surface of the wafer of any one or more failed chips are stored in a data server, which method further comprises:

converting the data by mapping the position in such manner as to create converted data representing a converted position on a second surface of the wafer opposite to the first surface of the one or more failed chips.

* * * * *